United States Patent
Kailas

(10) Patent No.: US 10,331,829 B2
(45) Date of Patent: Jun. 25, 2019

(54) SYSTEM DESIGN USING ACCURATE PERFORMANCE MODELS

(71) Applicant: International Business Machines Corporation, Armonk, NY (US)

(72) Inventor: Krishnan K. Kailas, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 386 days.

(21) Appl. No.: 14/970,072

(22) Filed: Dec. 15, 2015

(65) Prior Publication Data

US 2017/0169149 A1 Jun. 15, 2017

(51) Int. Cl.
*G06F 17/50* (2006.01)

(52) U.S. Cl.
CPC ........ *G06F 17/5036* (2013.01); *G06F 17/505* (2013.01)

(58) Field of Classification Search
CPC ............... G06F 17/5036; G06F 17/504; G01R 31/2848; G01R 31/31704
See application file for complete search history.

(56) References Cited

U.S. PATENT DOCUMENTS

| | | |
|---|---|---|
| 7,562,322 B2 | 7/2009 | Lu |
| 8,751,984 B2 | 6/2014 | Safarpour et al. |
| 2005/0010882 A1 | 1/2005 | Winkelmann et al. |
| 2011/0161898 A1 | 6/2011 | Chauhdry et al. |

FOREIGN PATENT DOCUMENTS

CN 102567165 B 7/2012

OTHER PUBLICATIONS

Herber, P. et al., "Automated Conformance Evaluation of SystemC Designs using Timed Automata," 2010 15th IEEE European Test Symposium (ETS), pp. 188-193, IEEE, 2010.
Sonntag, S. et al., "Performance Evaluation of VLSI platforms using SystemQ," In GI Jahrestagung (1), pp. 319-323, 2005.
Darringer, J. A.et al., "Early Analysis Tools for System-On-A-Chip Design," IBM Journal of Research and Development 46, No. 6, 2002, pp. 691-707.
Slobodova, A., "Formal Verification Methods for Industrial Hardware Design," SOFSEM 2001: Theory and Practice of Informatics, 2001, pp. 116-135.

*Primary Examiner* — Vuthe Siek
*Assistant Examiner* — Aric Lin
(74) *Attorney, Agent, or Firm* — Cuenot, Forsythe & Kim, LLC

(57) ABSTRACT

System design using accurate performance models may include generating, using a processor, a performance verification testbench from a hardware description language design and an automaton and determining, using the processor, a parameter of the design by analyzing the performance verification testbench using formal verification methods. The parameter is provably accurate. A performance model of a system under design including the design may be executed. The performance model uses the parameter. A determination may be made, using the processor, whether the system under design meets a system requirement according to a comparison of a result of executing the performance model with the system requirement.

20 Claims, 4 Drawing Sheets

SYSTEM DESIGN USING ACCURATE PERFORMANCE MODELS

BACKGROUND

This disclosure relates to system design and, more particularly, to designing a system using accurate performance models. A performance model is a representation of a system that is intended to mimic the way in which a system operates. A performance model may be used to verify performance metrics of the system. As an illustrative example, a complex system such as a central processing unit may be modeled using one or more performance models. The performance models may be used to analyze aspects of the system relating to resource consumption, possible contention for resources, and delays introduced by processing and/or other physical limitations within the system.

The performance models for a system are often constructed in the early stages of system design. Typically, performance models are developed from a high-level specification of the system being developed. As such, the various parameters incorporated into the performance model such as expected throughput and latency are educated guesses of the expected performance of the system.

SUMMARY

An embodiment of the present invention may include a method. The method may include generating, using a processor, a performance verification testbench from a hardware description language (HDL) design and an automaton and determining, using the processor, a parameter of the design by analyzing the performance verification testbench using formal verification methods. The parameter is provably accurate. The method may include executing, using the processor, a performance model of a system under design (SUD) including the design. The performance model uses the parameter. The method may also include determining, using the processor, whether the SUD meets a system requirement according to a comparison of a result of executing the performance model with the system requirement.

Another embodiment of the present invention may include a computing system having a processor programmed to initiate executable operations. The executable operations may include generating a performance verification testbench from an HDL design and an automaton and determining a parameter of the design by analyzing the performance verification testbench using formal verification methods. The parameter is provably accurate. The executable operations may include executing a performance model of an SUD including the design, wherein the performance model uses the parameter. The executable operations may also include determining whether the SUD meets a system requirement according to a comparison of a result of executing the performance model with the system requirement.

Another embodiment of the present invention may include a computer program including a computer readable storage medium having program code stored thereon. The program code is executable by a processor to perform a method. The method may include generating, using the processor, a performance verification testbench from an HDL design and an automaton and determining, using the processor, a parameter of the design by analyzing the performance verification testbench using formal verification methods. The parameter is provably accurate. The method may include executing, using the processor, a performance model of an SUD including the design. The performance model uses the parameter. The method may also include determining, using the processor, whether the SUD meets a system requirement according to a comparison of a result of executing the performance model with the system requirement.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

This disclosure relates to system design and, more particularly, to designing a system using accurate performance models. In accordance with the inventive arrangements disclosed herein, accurate performance models may be used to determine whether a particular system under design is meeting established design requirements. The performance models may utilize one or more parameters. The parameters may be determined from a formal verification process performed using a performance verification testbench of the system under design or a portion of the system under design. In one arrangement, the system under design, or a portion thereof, may be expressed in a hardware description language (HDL). The HDL description may be synthesized to generate a netlist. Formal verification procedures may be implemented using the performance verification testbench to determine provably accurate parameters. These parameters may then be included, or used within, the performance models to determine whether the system under design is meeting the established system requirements.

Figure 1:
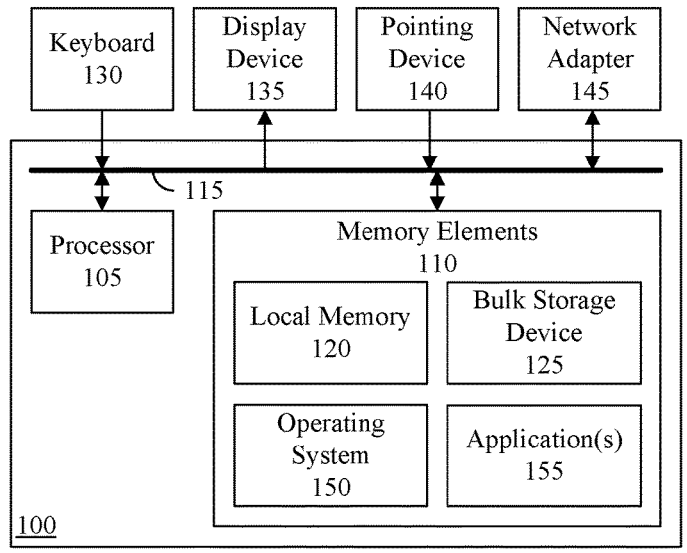
FIG. 1 is a block diagram illustrating an exemplary computing system.

FIG. 1 is a block diagram illustrating an exemplary computing system 100. Computing system 100 includes at least one processor, e.g., a central processing unit (CPU), 105 coupled to memory elements 110 through a system bus 115 or other suitable circuitry. Computing system 100 stores program code within memory elements 110. Processor 105 executes the program code accessed from memory elements 110 via system bus 115. In one aspect, computing system 100 may be implemented as a computer or other data processing system. It should be appreciated, however, that computing system 100 can be implemented in the form of any system including a processor and memory that is capable of performing the functions described within this disclosure.

Memory elements 110 include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. Computing system 100 may also include one or more cache memories (not shown) that provide temporary storage of at least some program code in order to reduce the number of times program code must be retrieved from bulk storage device 125 during execution.

Input/output (I/O) devices such as a keyboard 130, a display device 135, and a pointing device 140 may optionally be coupled to computing system 100. The I/O devices may be coupled to computing system 100 either directly or through intervening I/O controllers. A network adapter 145 may also be coupled to computing system 100 to enable computing system 100 to become coupled to other systems, computer systems, remote printers, and/or remote storage devices through intervening private or public networks. Modems, cable modems, Ethernet cards, and wireless transceivers are examples of different types of network adapter 145 that may be used with computing system 100.

Memory elements 110 store an operating system 150 and an application 155. Operating system 150 and application 155, being implemented in the form of executable program code, are executed by computing system 100. As such, operating system 150 and/or application 155 may be considered an integrated part of computing system 100. Application 155 and any data items used, generated, and/or operated upon by computing system 100 while executing application 155 are functional data structures that impart functionality when employed as part of computing system 100.

Figure 2:
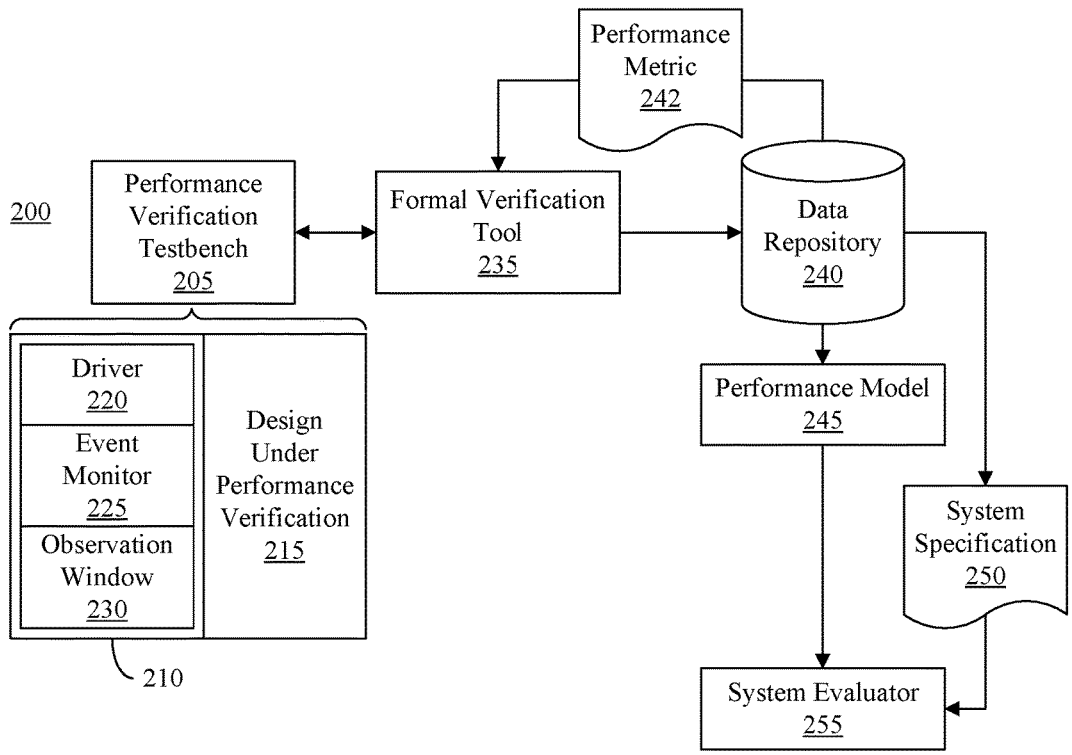
FIG. 2 is a block diagram illustrating an exemplary software architecture.

FIG. 2 is a block diagram illustrating an exemplary software architecture (architecture) 200. Architecture 200 may be executed by computing system 100 of FIG. 1 or by a plurality of interconnected, e.g., networked, computing systems each implemented as generally described with reference to FIG. 1. Architecture 200 may be used to determine the performance of a system under design (SUD). Based upon the determined performance of the SUD, the computing system may modify the SUD and/or the system specification for the SUD.

Architecture 200 may include a performance verification testbench 205. In one embodiment, performance verification testbench 205 may be implemented as a netlist. Performance verification testbench 205 may include an automaton 210 and a design under performance verification (DUPV) 215. In one exemplary arrangement, automaton 210 may include a driver 220, an event monitor 225, and an observation window 230. In one aspect, DUPV 215 may represent the entire SUD. In another aspect, DUPV 215 may represent only a portion of the SUD.

Automaton 210 and DUPV 215 may be specified as HDL descriptions and synthesized into a netlist to implement performance verification testbench 205. An HDL description of a system is an abstract, programmatic, and behavioral description of the digital system. Examples of HDLs may include, but are not limited to, Verilog and VHDL. HDLs are sometimes referred to as register transfer level (RTL) descriptions of circuit designs and/or digital systems.

As defined herein, the term "hardware description language" or "HDL" is a computer-language that facilitates the documentation, design, and manufacturing of a digital system, such as an integrated circuit. An HDL is expressed in human readable form and combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, e.g., clocks and/or clock signals, which is a primary attribute of a digital system. For example, an HDL design may describe the behavior of a circuit design as data transfers occur between registers each clock cycle.

Synthesis refers to the process of converting, or translating, the HDL description of a system into a low-level design implementation of interconnected logic gates referred to as a netlist. Synthesis may also include mapping. Mapping is the process of correlating, or matching, the logic gates of the low-level circuit design to the various types of physical circuit blocks that may be available in the particular IC in which the circuit design is to be implemented. For example, since a lookup table (LUT) may implement a complex function, one or more logic gates of the low-level design implementation may be mapped to a single LUT, or other available circuit block, of the target IC. The mapped circuit design specifies the same functionality as the low-level design implementation, albeit in terms of the particular circuit blocks available on the target IC as opposed to the low-level logic gates.

Driver 220 may be configured to non-deterministically provide, or drive, input signals to DUPV 215. Driver 220 may provide input signals that conform to an established system specification 250 that defines the operation, performance metrics, and other aspects of the SUD. For example, system specification 250 may include one or more constraints relating to DUPV 215. Exemplary constraints of system specification 250 may be that DUPV 215 is to handle "N" requests per cycle and/or only have "M" outstanding requests at a given time. In this example, "N" and "M" are integer values greater than zero. Driver 220 is configured to drive DUPV 215 non-deterministically with signals that conform to, i.e., do not violate, the stated constraints of specification 250. As such, in this example, driver 220 provides only up to N requests per cycle and only allows M outstanding requests at any given time as would be the case for an actual implementation of DUPV 215.

Event monitor 225 may be configured to detect events that occur in one or more signals of DUPV 215 in response to DUPV 215 receiving the non-deterministic input signals from driver 220. Event monitor 225, for example, may include logic configured to count events such as a number of requests granted, or the like, that characterize performance of the design according to system specification 250. Observation window 230 may be configured as a non-deterministic observation window. In one arrangement, observation window 230 may include a counter that specifies the length of an observation interval and/or an event trigger for non-deterministically starting the observation interval. In one aspect, event monitor 225 may detect only those events occurring within the observation interval defined by observation window 230.

In one arrangement, performance verification testbench 205 may interact with formal verification tool 235. Formal verification tool 235, being implemented as executable program code, may perform one or more decision procedures in interacting with performance verification testbench 205. In general, a decision procedure is a series of operations that, given a decision problem, terminates with a correct yes or no answer. In implementing the one or more decision procedures, formal verification tool 235 may interact with performance verification testbench 205 and perform analysis to determine whether the properties of DUPV 215 hold true when driven in all possible ways that are still constrained by design specification 250 and by operational limits enforced by driver 220.

More particularly, formal verification tool 235 may be configured to implement one or more formal verification techniques where correctness of an aspect of DUPV 215 specified by performance metric 242 is proven or falsified (proven to be incorrect). Formal verification tool 235 may determine whether performance metric 242 has been proven correct or falsified based on the received results from analysis of performance verification testbench 205. Formal verification tool 235 may increase or decrease performance metric 242 based upon whether the results obtained from performance verification testbench 205 indicate that performance metric 242 was proven or falsified (proven to be incorrect).

For example, formal verification tool 235 may evaluate all possible results from analysis of performance verification testbench 205 as determined by observation window 230. Formal verification tool 235 may analyze performance verification testbench 205 to determine whether a specified performance metric 242, as defined within system specification 250, holds true in all the possible state space in which DUPV 215 may exist and in all state transitions through which DUPV 215 may undergo during operation. Formal verification tool 235 may provide, in the case when the specified performance metric is not attained by DUPV 215, a counter-example trace showing a sequence of input transitions that will drive DUPV 215 into a scenario in which the performance matric is violated. As pictured, system specification 250 may be stored in data repository 240. Data repository 240 may represent a data storage area within memory elements 110.

In another arrangement, at least initially, performance metric 242 may be an estimate of the performance expected from DUPV 215. Performance metric 242 may be an educated guess of the expected performance from DUPV 215 as may be determined by a designer of the SUD or the like. As an illustrative example, performance metric 242 may specify an expected maximum throughput of DUPV 215, a maximum latency for responding to requests, a minimum throughput of DUPV 215, a minimum latency for responding to requests, and the like. As analysis of performance verification testbench 205 is repeated and/or the process iterates under control of formal verification tool 235, performance metric 242 may be updated in accordance with results obtained from the analysis of performance verification testbench 205. In one aspect, the computing system may update performance metric 242 automatically.

In one aspect, formal verification tool 235 may not "execute" or "simulate" the testbench as in traditional simulation-based testing. In accordance with the inventive arrangements described herein, formal verification tool 235 may analyze performance verification testbench 205 for the purpose of proving or falsifying the properties specified. In one arrangement, formal verification tool 235 may include one or more rules (e.g., Boolean expressions written in HDL) such as "the request-to-grant latency is less than 20 cycles" as the property to be checked (e.g., performance metric 242). Formal verification tool 235, based upon the analysis of performance verification testbench 205, may generate a result that indicates whether the specified property holds true for all the possible state transitions allowed within the constraints imposed by the operating conditions of design specification 250, or a falsification result indicating that property does not hold true.

In the foregoing example, obtaining a proof means that the request-to-grant latency will always be less than 20 cycles. In a further aspect, a falsification result may include a counter-example trace showing one of the possible scenarios in which performance metric 242 does not hold true. The counter-example trace may show a scenario in which a sequence of input transitions cause the request-to-grant delay to exceed 20 cycles, e.g., rise to 25 cycles. In one arrangement, formal verification tool 235 may simulate performance verification testbench 205 to generate the counter-example trace in the case of falsification. It should be appreciated, however, that formal verification tool 235 may determine yes/no answers either with or without a counter-example trace.

In one arrangement, responsive to determining that performance metric 242 has been proven correct, formal verification tool 235 may store the result from analysis of performance verification testbench 205 in data repository 240. As an example, formal verification tool 235 may store performance metric 242 as an accurate parameter of DUPV 215 and, as such, the SUD that has been proven valid. In another arrangement, responsive to determining that performance metric 242 has been falsified, formal verification tool 235 may update performance metric 242, e.g., relax the design requirement, and continue analysis of performance verification testbench 205 in order to perform formal validation of the updated version of performance metric 242.

For example, suppose 20 cycles is the expected worst-case (maximum) request-to-grant latency of an arbiter design used in a cache controller. During the first step, formal verification tool 235 may analyze performance verification testbench 235 to prove that the request-to-grant delay is always less than or equal to 20 cycles. If the result of the analysis turns out to be false, in the subsequent iterative steps, formal verification tool 235 may determine whether the request-to-grant latency is at most 21 cycles, 22 cycles, etc., until formal verification tool 235 obtains a proof that shows that the request-to-grant delay is at most 25 cycles.

The parameters, e.g., performance metrics, determined from analysis of performance verification testbench 205 to be accurate and validated by formal verification tool 235 may be retrieved from data repository 240 and used in performance model 245. Performance model 245 may be executable program code that may be parameterized with the parameters, or performance metrics, proven to be accurate. Performance model 245 may be executed using the parameters of DUPV 215 determined to be valid. Results from execution of performance model 245 may be provided to system evaluator 255. As shown, system evaluator 255 may also retrieve system specification 250 from data repository 240. System evaluator 255 may compare the results from execution of performance model 245 with system specification 250 and determine whether the SUD, as modeled by performance model 245, meets system specification 250. If not, system specification 250 and/or the DUPV 215 may be updated. In one aspect, the computing system may update system specification 250 and/or DUPV 215 automatically.

As discussed, performance models such as performance model 245 may be used to predict the performance of a particular system being modeled (e.g., the SUD). Performance models may also be referred to as "timer models." In general, performance models may be used to simulate important events that may occur during operation of the SUD. The performance model may simulate an event caused by an external or internal input and determine when to schedule the next dependent event(s) to be simulated. In one aspect, the performance model may schedule the next dependent event(s) using a cycle-driven technique. In another aspect, the performance model may schedule the next dependent event(s) using an event-driven technique. Still other performance models may use a hybrid technique.

Performance models may be programmed with latency, which is the time taken to complete a particular operation, and/or throughput, which is the amount of work completed in unit time by a specific component. Accordingly, the accuracy of the results obtained from execution of the performance model(s) may be highly dependent upon knowledge of latency and throughput values for various components of the system. In accordance with the inventive arrangements disclosed herein, latency and throughput may be determined using performance verification testbench 205 as opposed to relying upon estimation, which may not capture some unexpected side effects and/or practical limitations introduced during implementation of the SUD.

As illustrated in FIG. 2, performance model 245 may be generated, at least in part, using parameters that have been formally verified as accurate using the synthesized HDL description of the SUD or a portion of the SUD. Parameters for the design such as throughput and latency, once formally verified, may be used within performance model 245 to provide increased accuracy when used to determine whether the SUD is meeting requirements of system specification 250.

Consider an example where the SUD is a processor that includes a cache system and DUPV 215 is an implementation of the cache system. System specification 250 may specify a performance metric 242 such as that the cache system is to perform with a certain throughput. System specification 250 may include a higher level performance metric specifying that the processor is to provide a particular number of MIPS (million instructions per second). The higher level performance metric may impose further performance metrics on subsystems such as the cache system. Provably accurate performance metrics from DUPV 215 may be used in performance model 245 for the processor. In another example, DUPV 215 may represent the entire SUD, which may be the cache system.

Figure 3:
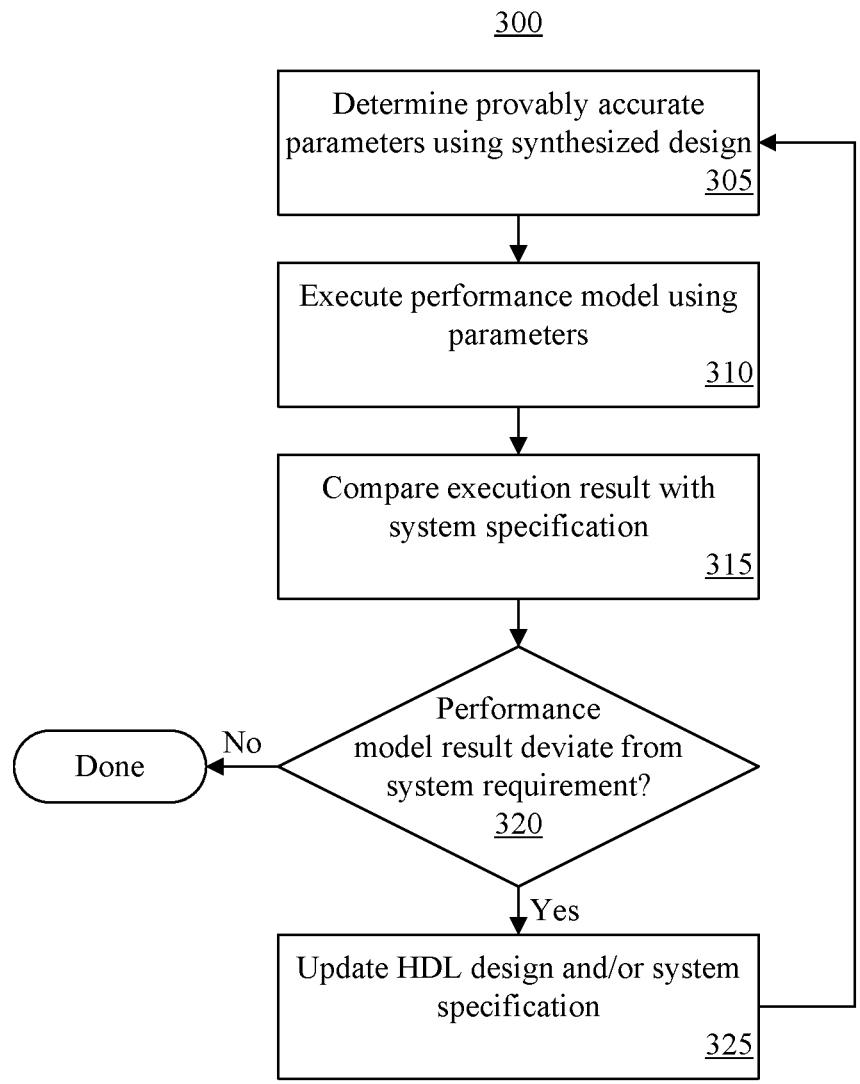
FIG. 3 is a flow chart illustrating an exemplary method of system design.

FIG. 3 is a flow chart illustrating an exemplary method 300 of system design. Method 300 may be implemented by computing system 100 described with reference to FIG. 1. Computing system 100 may execute, or include, an architecture as described generally with reference to FIG. 2.

In block 305, the computing system may determine one or more provably accurate parameters using the performance verification testbench. The computing system may analyze the performance verification testbench including the DUPV and the automaton. For example, the computing system may determine the latency and/or throughput of the DUPV by analyzing the performance verification testbench. The computing system further may verify the results against one or more performance metrics for the SUD and/or the DUPV.

In block 310, the computing system may execute a performance model using the provably accurate parameter(s) determined in block 305. The computing system may include the provably accurate parameters determined in block 305 from analysis of the performance verification testbench and execute the performance model. For example, one or more elements of the execution model may be parameterized using the provably accurate parameters determined in block 305.

In block 315, the computing system may compare an execution result of the performance model with a system requirement from the system specification. In one example, the DUPV may be a portion or a particular component of the larger system. In this regard, the design requirement may be specifically applicable to the component represented by the DUPV. In another aspect, the system requirement may be a higher level requirement for the SUD that may be specified by abstracting the portion of the SUD represented by the DUPV within the performance model using the latency and/or throughput determined as provably accurate parameters in block 305.

In block 320, the computing system may determine whether the result from execution of the performance model deviates from the system requirement. If so, method 300 may continue to block 325. If not, method 300 may end. For example, the computing system may determine whether state changes of the performance model conform with, i.e., do not violate, the system requirement.

In block 325, the computing system may update the HDL design and/or update the system specification. As noted, in one aspect, the computing system may perform the update automatically. Since the performance model indicates that the SUD is not meeting the system requirements per the system specification, the computing system may relax a system requirement and/or modify the HDL design. In the case where the HDL design is modified, the computing system may then need to re-synthesize the HDL design in combination with the automaton to generate a new and/or updated performance verification testbench for continued operation and analysis.

Figure 4:
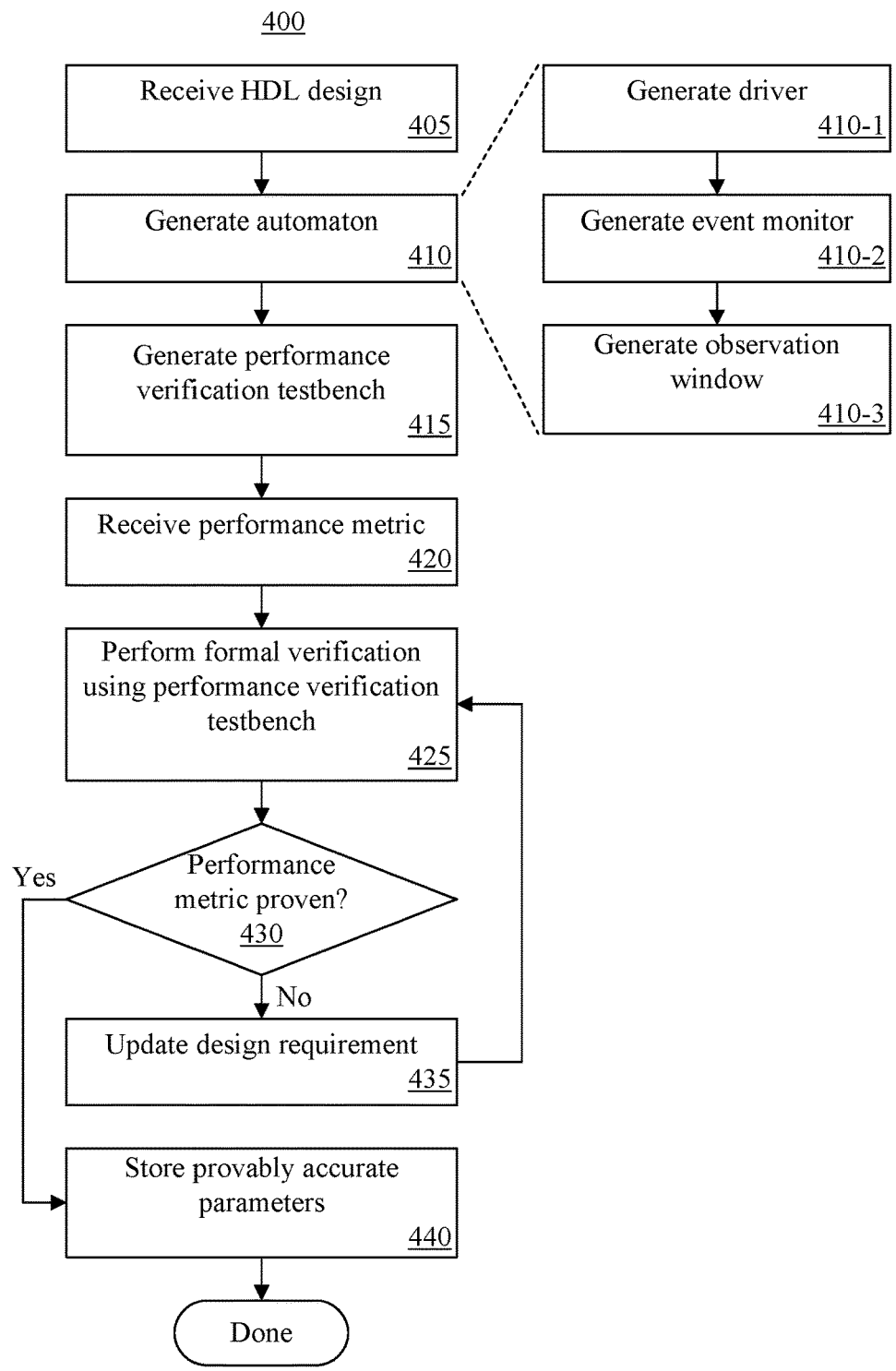
FIG. 4 is a flow chart illustrating an exemplary method of determining provably accurate parameters using an HDL design.

FIG. 4 is a flow chart illustrating an exemplary method 400 of determining provably accurate parameters using an HDL design. Method 400 may be performed by a computing system such as system 100 of FIG. 1. In one embodiment, method 400 may be performed to implement block 305 of FIG. 3.

In block 405, the computing system may receive an HDL design. In block 410, the system may generate an automaton for the HDL design. As noted, the automaton may include a driver, an event monitor, and an observation window. The computing system may generate HDL descriptions for the driver, the event monitor, and the observation window. For example, in block 410-1, the computing system may generate the driver. In block 410-2, the computing system may generate the event monitor. In block 410-3, the computing system may generate the observation window.

In block 415, the computing system may generate the performance verification testbench. The computing system may compile, e.g., synthesize, the HDL design and the automaton into a single netlist as the performance verification testbench. In block 420, the computing system may receive a performance metric. In one aspect, during a first iteration of method 400, the computing system may receive an initial performance metric. The initial design requirement may be an estimate of the performance metrics that are to be determined.

In block 425, the computing system may perform formal verification by analyzing the performance verification testbench. In one aspect, the formal verification tool may implement a decision procedure that may prove or falsify the performance metric. The computing system may use formal verification techniques to iteratively prove the performance metric such as throughput and/or latency.

In illustration, the computing system, in executing the performance verification testbench, may determine a maximum number of events that may occur for a given constraint on the SUD. For example, the computing system may determine a maximum sustained bandwidth consumed for a given rate of grants and a given rate of issuing requests. The computing system may implement a similar technique to iteratively prove whether a performance metric such as the maximum and/or minimum latency of the DUPV is provably correct. As another example, the computing system may implement a technique to iteratively prove whether a performance metric such as the maximum and/or minimum latency for issuing grants responsive to received requests is provably correct. For example, in order to determine the minimum value of a performance metric, the formal verification tool may start with a large initial value that will likely result in a "No" (falsification) in block 430. In 435, the value of the performance metric may be decremented and the formal verification step 425 is carried out. This iterative process may continue until the formal verification tool obtains a proof stating that the value of the performance metric cannot be lower than the value used in the last iteration (corresponding to the "Yes" branch in 430).

In block 430, the computing system may determine whether the performance metric was proven true. If so, method 400 may continue to block 440. If not, method 400 may continue to block 435. For example, the event window of the performance verification testbench may specify a window of 100 clock cycles and count the number of events occurring within that 100 cycle window. Applying this non-deterministically, the computing system may prove the minimum and/or maximum values for latency and/or throughput in terms of the defined time interval.

In block 435, the computing system may update the performance metric. As noted, in one aspect, the computing system may perform the update automatically. For example, responsive to falsifying the performance metric, the computing system may update the performance metric by relaxing, or reducing, the performance metric (e.g., increasing the latency specified by the performance metric or reducing the throughput per unit time). In block 440, the computing system may store the provably accurate parameter.

In one example, the computing system may use a binary search approach. In some cases, the computing system may apply an iterative proof method that takes many steps to converge, resulting in a proof. During such a process, the value of the performance matric may be incremented or decremented in a linear fashion to explore the search space. In the case of a binary search approach, the computing system may apply a binary search algorithm to assign values in the iterative steps in an attempt to reduce the number of steps needed for convergence up to the logarithm of the number of steps needed by the linear search method in the worst-case. When the binary search method is used for assigning the values, the computing system may assign the values so that the search space is divided in half for each iterative step. For example, consider the case where the range of values to be checked is 1 to 100. In that case, the computing system may assign the value 50 first to decide whether the value is 50, the value is in the lower half (1-49), or in the upper half (51-100) of the range. If the computing system determines that the value is in the 51-100 range, in the next iterative step, the computing system may select a value of 75 to check whether the final answer is 75, is in the range 51-74, or is in the range of 76-100. The computing system may repeat the process until the final result is obtained.

As discussed, the HDL design may represent an entire SUD or a portion of an SUD. For example, the HDL of an SUD may be decomposed into smaller portions in order to facilitate proof of accurate parameters. Method 400 may be applied hierarchically to build the characteristics of large portions of logic. The computing system, for example, may use a provably equivalent, accurate, and simplified model based on the results obtained for the smaller portion of logic represented by the HDL design. The simplified model may then be incorporated into the HDL design to replace the original HDL logic therein to make a large, complex HDL design amenable to performance modeling.

Method 400 may be performed iteratively to prove and/or disprove additional performance metrics. For example, continued performance of method 400 for a plurality of performance metrics allows the computing system to build a library of cases, e.g., provably accurate performance metrics or parameters, that may be utilized in the performance model of the SUD.

Figure 5:
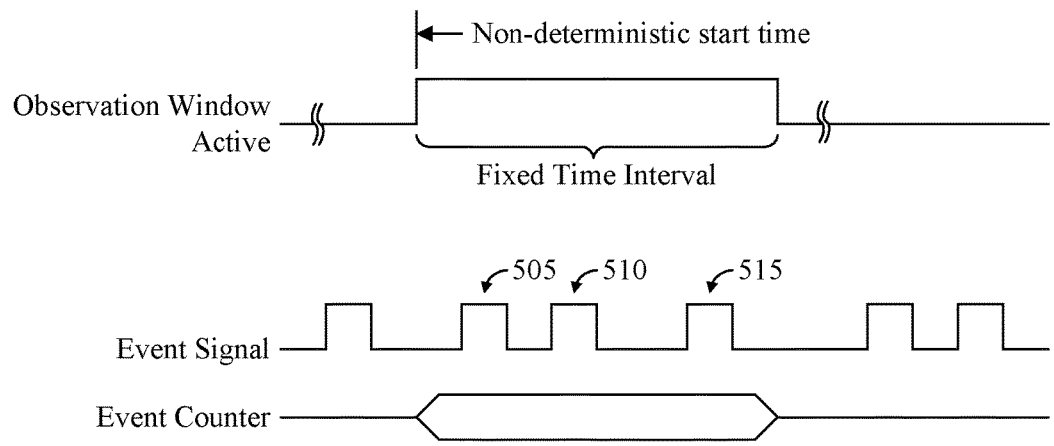
FIG. 5 is an example of throughput waveforms generated by an automaton for determining the throughput of a design.

FIG. 5 is an example of waveforms generated by an automaton for determining the throughput parameter of a design. More particularly, FIG. 5 illustrates waveforms, or signals, generated by an automaton as compiled with an HDL design to form a performance verification testbench. FIG. 5 shows an example where the observation window, as defined by the observation window active signal, goes high, indicating an active state, at a non-deterministic start time. The event counter is active during the fixed time interval while the observation window signal is high. In this example, the computing system detects three events shown as events 505, 510, and 515 using an event counter. Events outside of the fixed time interval for the observation window are not counted. An automaton that implements the non-deterministic observation window may allow the formal verification tool to prove the maximum and minimum number of events that may be observed in all possible execution scenarios of the DUPV.

Figure 6:
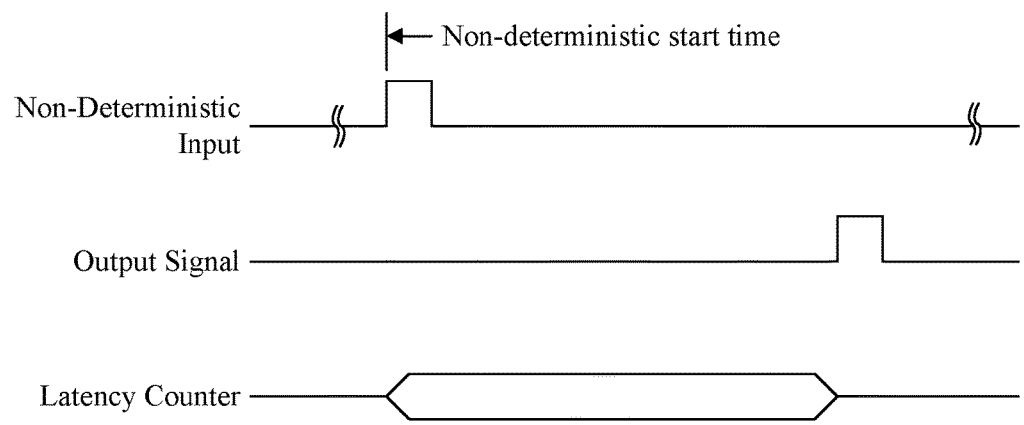
FIG. 6 is an example of latency waveforms generated by an automaton for determining the latency parameter of a design.

FIG. 6 is an example of waveforms generated by an automaton for determining the latency parameter of a design. More particularly, FIG. 6 illustrates waveforms, or signals, generated by an automaton as compiled with an HDL design to form a performance verification testbench. FIG. 6 shows an example where a non-deterministic input goes high at a non-deterministic time. Responsive to the non-deterministic input signal going high, a latency counter begins counting the number of clock cycles until a response is received, where the output signal goes high. An automaton that implements the non-deterministic excitation of an input signal will allow the formal verification tool to prove the maximum and minimum latency that may be observed in all possible execution scenarios of the DUPV.

While the disclosure concludes with claims defining novel features, it is believed that the various features described herein will be better understood from a consideration of the description in conjunction with the drawings. The process(es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. Notwithstanding, several definitions that apply throughout this document now will be presented.

As defined herein, the singular forms "a," "an," and "the" are intended to include the plural forms as well, unless the context clearly indicates otherwise.

As defined herein, the term "another" means at least a second or more.

As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system.

As defined herein, the term "executable operation" or "operation" is a task performed by a data processing system or a processor within a data processing system unless the context indicates otherwise. Examples of executable operations include, but are not limited to, "processing," "computing," "calculating," "determining," "displaying," "comparing," or the like. In this regard, operations refer to actions and/or processes of the data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

As defined herein, the term "output" means storing in physical memory elements, e.g., devices, writing to display or other peripheral output device, sending or transmitting to another system, exporting, or the like.

As defined herein, the term "plurality" means two or more than two.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms "program code," "software," "application," and "executable code" mean any expression, in any language, code or notation, of a set of instructions intended to cause a data processing system to perform a particular function either directly or after either or both of the following: a) conversion to another language, code, or notation; b) reproduction in a different material form. Examples of program code may include, but are not limited to, a subroutine, a function, a procedure, an object method, an object implementation, an executable application, an applet, a servlet, source code, object code, a shared library/ dynamic load library and/or other sequence of instructions designed for execution on a computer system.

As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "user" means a human being.

The terms first, second, etc. may be used herein to describe various elements. These elements should not be limited by these terms, as these terms are only used to distinguish one element from another unless stated otherwise or the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   generating, using a processor, a performance verification testbench from a hardware description language design and an automaton;
   determining, using the processor, a parameter of the design by analyzing the performance verification testbench using formal verification methods, wherein the parameter is provably accurate;

executing, using the processor, a performance model of a system under design including the design, wherein the performance model uses the parameter; and determining, using the processor, whether the system under design meets a system requirement according to a comparison of a result of executing the performance model with the system requirement.

2. The method of claim 1, wherein generating a performance verification testbench from a hardware description language design and an automaton further comprises:
synthesizing the hardware description language design and a hardware description language description of the automaton into a netlist.

3. The method of claim 1, wherein the parameter of the design comprises latency.

4. The method of claim 1, wherein the parameter of the design comprises throughput.

5. The method of claim 1, wherein determining a parameter of the design by analyzing the performance verification testbench using formal verification methods comprises:
iteratively providing non-deterministic inputs to the design in the performance verification testbench in accordance with a system specification;
detecting events responsive to the non-deterministic inputs during a non-deterministic event window; and
comparing the detected events with a performance metric.

6. The method of claim 5, further comprising:
responsive to determining that the performance metric is proven, storing the performance metric as the parameter for inclusion in the execution model.

7. The method of claim 5, further comprising:
responsive to determining that the initial design requirement is falsified, updating the performance metric.

8. A computing system, comprising:
a processor programmed to initiate executable operations comprising:
generating a performance verification testbench from a hardware description language design and an automaton;
determining a parameter of the design by analyzing the performance verification testbench using formal verification methods, wherein the parameter is provably accurate;
executing a performance model of a system under design including the design, wherein the performance model uses the parameter; and
determining whether the system under design meets a system requirement according to a comparison of a result of executing the performance model with the system requirement.

9. The computing system of claim 8, wherein generating a performance verification testbench from a hardware description language design and an automaton further comprises:
synthesizing the hardware description language design and a hardware description language description of the automaton into a netlist.

10. The computing system of claim 8, wherein the parameter of the design comprises latency.

11. The computing system of claim 8, wherein the parameter of the design comprises throughput.

12. The computing system of claim 8, wherein determining a parameter of the design by analyzing the performance verification testbench using formal verification methods comprises:

iteratively providing non-deterministic inputs to the design in the performance verification testbench in accordance with a system specification;
detecting events responsive to the non-deterministic inputs during a non-deterministic event window; and
comparing the detected events with a performance metric.

13. The computing system of claim 12, wherein the processor is further programmed to initiate executable operations comprising:
responsive to determining that the performance metric is proven, storing the performance metric as the parameter for inclusion in the execution model.

14. The computing system of claim 12, wherein the processor is further programmed to initiate executable operations comprising:
responsive to determining that the initial design requirement is falsified, updating the performance metric.

15. A computer program product comprising a computer readable storage medium having program code stored thereon, the program code executable by a processor to perform a method comprising:
generating, using the processor, a performance verification testbench from a hardware description language design and an automaton;
determining, using the processor, a parameter of the design by analyzing the performance verification testbench using formal verification methods, wherein the parameter is provably accurate;
executing, using the processor, a performance model of a system under design including the design, wherein the performance model uses the parameter; and
determining, using the processor, whether the system under design meets a system requirement according to a comparison of a result of executing the performance model with the system requirement.

16. The computer program product of claim 15, wherein generating a performance verification testbench from a hardware description language design and an automaton further comprises:
synthesizing the hardware description language design and a hardware description language description of the automaton into a netlist.

17. The computer program product of claim 15, wherein the parameter of the design comprises at least one of latency or throughput.

18. The computer program product of claim 15, wherein determining a parameter of the design by analyzing the performance verification testbench using formal verification methods comprises:
iteratively providing non-deterministic inputs to the design in the performance verification testbench in accordance with a system specification;
detecting events responsive to the non-deterministic inputs during a non-deterministic event window; and
comparing the detected events with a performance metric.

19. The computer program product of claim 18, wherein the method further comprises:
responsive to determining that the performance metric is proven, storing the performance metric as the parameter for inclusion in the execution model.

20. The computer program product of claim 18, wherein the method further comprises:
responsive to determining that the initial design requirement is falsified, updating the performance metric.

* * * * *